(12) United States Patent
Eckholm et al.

(10) Patent No.: US 9,010,449 B2
(45) Date of Patent: Apr. 21, 2015

(54) METHODS AND APPARATUS FOR HOT AISLE/COLD AISLE DATA CENTER FIRE SUPPRESSION

(75) Inventors: William A. Eckholm, Scottsdale, AZ (US); William David Hoffman, Cave Creek, AZ (US)

(73) Assignee: Firetrace USA, LLC, Scottsdale, AZ (US)

( * ) Notice: Subject to any disclaimer, the term of this patent is extended or adjusted under 35 U.S.C. 154(b) by 377 days.

(21) Appl. No.: 13/559,190

(22) Filed: Jul. 26, 2012

(65) Prior Publication Data

US 2013/0025888 A1 Jan. 31, 2013

Related U.S. Application Data

(60) Provisional application No. 61/511,816, filed on Jul. 26, 2011.

(51) Int. Cl.
*A62C 3/16* (2006.01)
*A62C 37/44* (2006.01)
*H05K 7/20* (2006.01)

(52) U.S. Cl.
CPC .. *A62C 3/16* (2013.01); *A62C 37/44* (2013.01)

(58) Field of Classification Search
CPC .......... A62C 3/16; A62C 37/04; A62C 37/36; A62C 37/44; H05K 7/20; H05K 7/20009; H05K 7/20136; H05K 7/20145; H05K 7/202; H05K 7/206

USPC .......... 169/11, 16, 43, 45, 46, 54, 56, 60, 61; 454/184, 187; 361/690, 694, 695; 165/80.2, 80.3; 62/259.2

See application file for complete search history.

(56) References Cited

U.S. PATENT DOCUMENTS

| | | | |
|---|---|---|---|
| 6,491,254 B1 | 12/2002 | Walkinshaw et al. | |
| 6,518,574 B1 | 2/2003 | Castleman | |
| 2005/0225936 A1* | 10/2005 | Day | 361/687 |
| 2009/0168345 A1 | 7/2009 | Martini | |
| 2009/0211773 A1 | 8/2009 | Gooch | |
| 2011/0105010 A1 | 5/2011 | Day | |
| 2012/0031633 A1* | 2/2012 | Su et al. | 169/61 |
| 2012/0073840 A1* | 3/2012 | Prieur | 169/46 |

* cited by examiner

*Primary Examiner* — Darren W Gorman
(74) *Attorney, Agent, or Firm* — The Noblitt Group, PLLC

(57) ABSTRACT

Methods and apparatus for hot aisle/cold aisle data center fire suppression according to various aspects of the present invention include a detection system that is configured to be located proximate to a side of a computer cabinet facing a hot aisle and a discharge system that is configured to be located within a subfloor having a cooling airflow that is directed upwards from the subfloor through one or more vents in the subfloor and into a cold aisle. The detection system may be configured to detect a fire condition such as smoke exiting the cabinet and in response generate a signal that activates the discharge system. The discharge system may be configured to inject a fire suppressant into the cooling airflow, whereby the cooling airflow may facilitate delivery of the fire suppressant into the cold aisle and the computer cabinet.

20 Claims, 5 Drawing Sheets

METHODS AND APPARATUS FOR HOT AISLE/COLD AISLE DATA CENTER FIRE SUPPRESSION

CROSS-REFERENCES TO RELATED APPLICATIONS

This application claims the benefit of U.S. Provisional Patent Application No. 61/511,816, filed Jul. 26, 2011, and incorporates the disclosure of the application by reference.

BACKGROUND OF INVENTION

Computer server racks and/or cabinets positioned within a data center are commonly cooled via hot aisle/cold aisle containment systems to sustain high processing capacity while reducing total cooling utility costs. In these systems, cooling air is routed from an air handling unit through a subfloor where it is introduced into the data center through one or more vents in the subfloor positioned along a side of the cabinets. This side is referred to as the cold aisle. The cooling air then travels through the cabinet, collects heat from components located within the cabinet, and exits from the other side of the cabinet into a hot aisle where the then heated air returns to the air handling unit and is re-circulated forming a closed-loop system. To further aid cooling, computer cabinets may be arranged in an enclosed and/or partitioned area within the data center to better isolate the cold aisle from the hot aisle and to direct cooling capability to the inside of the computer cabinets. Alternatively, rather than fully enclose the computer server cabinets, a partition wall such as a plastic or vinyl screen may be placed between cabinets to facilitate air flow through each cabinet.

Fire suppression systems in these closed-loop cooling systems often utilize clean agents in place of water based sprinkler systems to prevent damage to the electronic components. These clean agents are commonly liquefied gasses that also act as refrigerants when discharged thereby creating a cooling effect on the environment within the data center. Upon discharge, a total flooding concept is followed that typically seeks to obtain a uniform distribution of the clean agent throughout the entire environment of the room where the computer cabinets are located. However, due to the possibility of human exposure, standards have been developed to establish acceptable concentration levels of clean agent that provide extinguishing capability below a maximum human exposure level. Obtaining a uniform distribution level within the acceptable standards is difficult due to the enclosures and partitions used to separate the hot and cold aisles. For example, a partition may inhibit the distribution of the clean agent throughout the environment or the natural flow of air caused by the cooling system itself may impede the clean agent from entering a cabinet in sufficient quantity to suppress a fire condition.

SUMMARY OF THE INVENTION

Methods and apparatus for hot aisle/cold aisle data center fire suppression according to various aspects of the present invention comprise a detection system that is configured to be located proximate to a side of a computer cabinet facing a hot aisle and a discharge system that is configured to be located within a subfloor having a cooling airflow that is directed upwards from the subfloor through one or more vents in the subfloor and into a cold aisle. The detection system may be configured to detect a fire condition such as smoke exiting the cabinet and in response generate a signal that activates the discharge system. The discharge system may be configured to inject a fire suppressant into the cooling airflow, whereby the cooling airflow may facilitate delivery of the fire suppressant into the cold aisle and the computer cabinet.

BRIEF DESCRIPTION OF THE DRAWINGS

A more complete understanding of the present invention may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present invention may be described in terms of functional block components and various processing steps. Such functional blocks may be realized by any number of components configured to perform the specified functions and achieve the various results. For example, the present invention may employ various types of sensors, dispersant equipment, ducting, storage equipment for various types of fire suppression materials, and the like, which may carry out a variety of functions. In addition, the present invention may be practiced in conjunction with any number of processes such as fire detection and suppression, hazard condition detection and control, ambient air temperature control, and total room flooding, and the system described is merely one exemplary application for the invention. Further, the present invention may employ any number of conventional techniques or control systems for dispersing fire suppressants, circulating air, detecting potential fire and/or hazardous conditions, and/or sensing concentrations of particulates in air within an enclosed environment.

Methods and apparatus for hot aisle/cold aisle data center fire suppression according to various aspects of the present invention may operate in conjunction with any suitable fire detection system and/or fire suppression material or agent. Various representative implementations of the present invention may be applied to any system for sensing and/or suppressing hazardous conditions.

Figure 1:
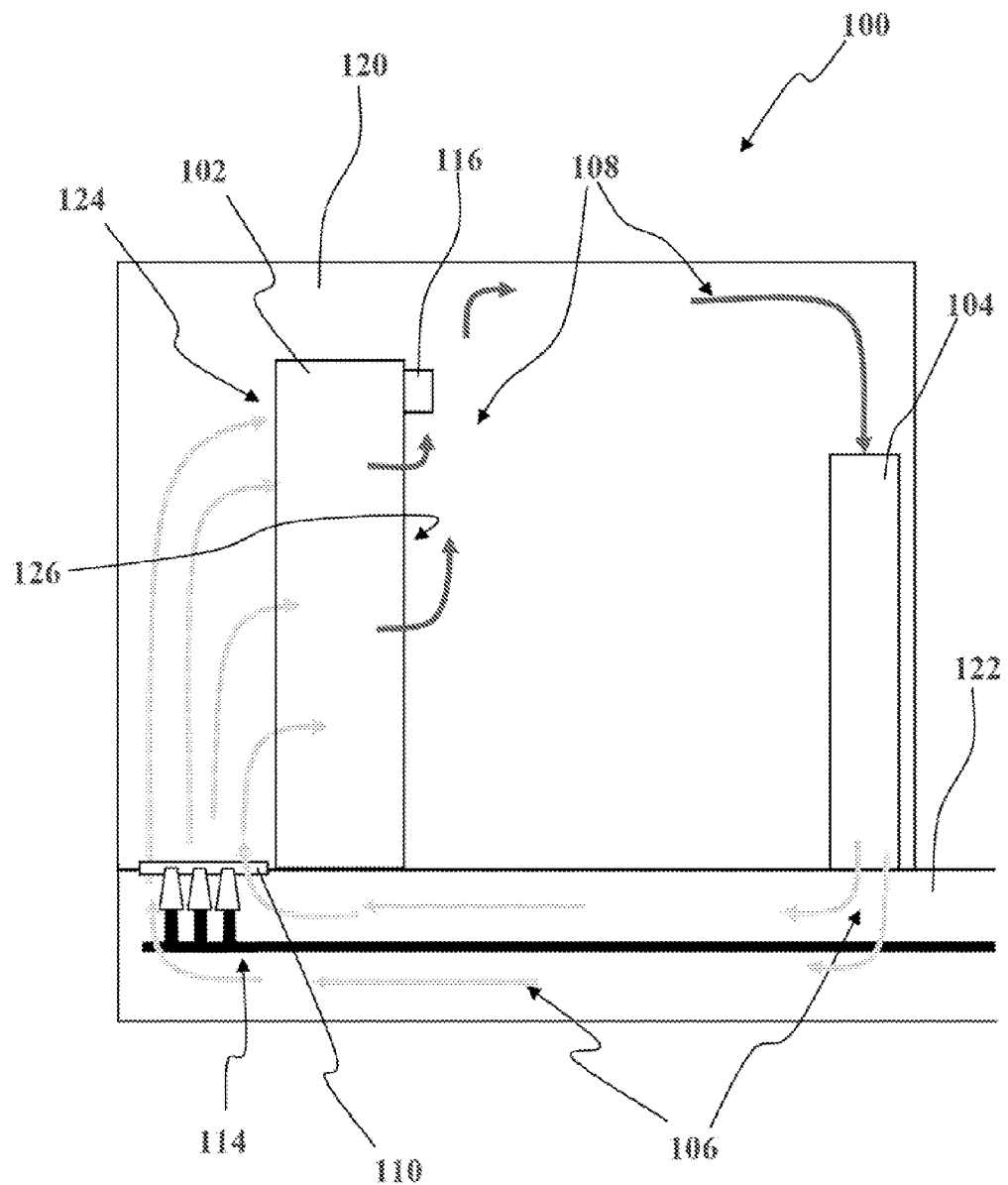
FIG. 1 representatively illustrates a hot aisle/cold aisle fire suppression system in accordance with an exemplary embodiment of the present invention.
Figure 2:
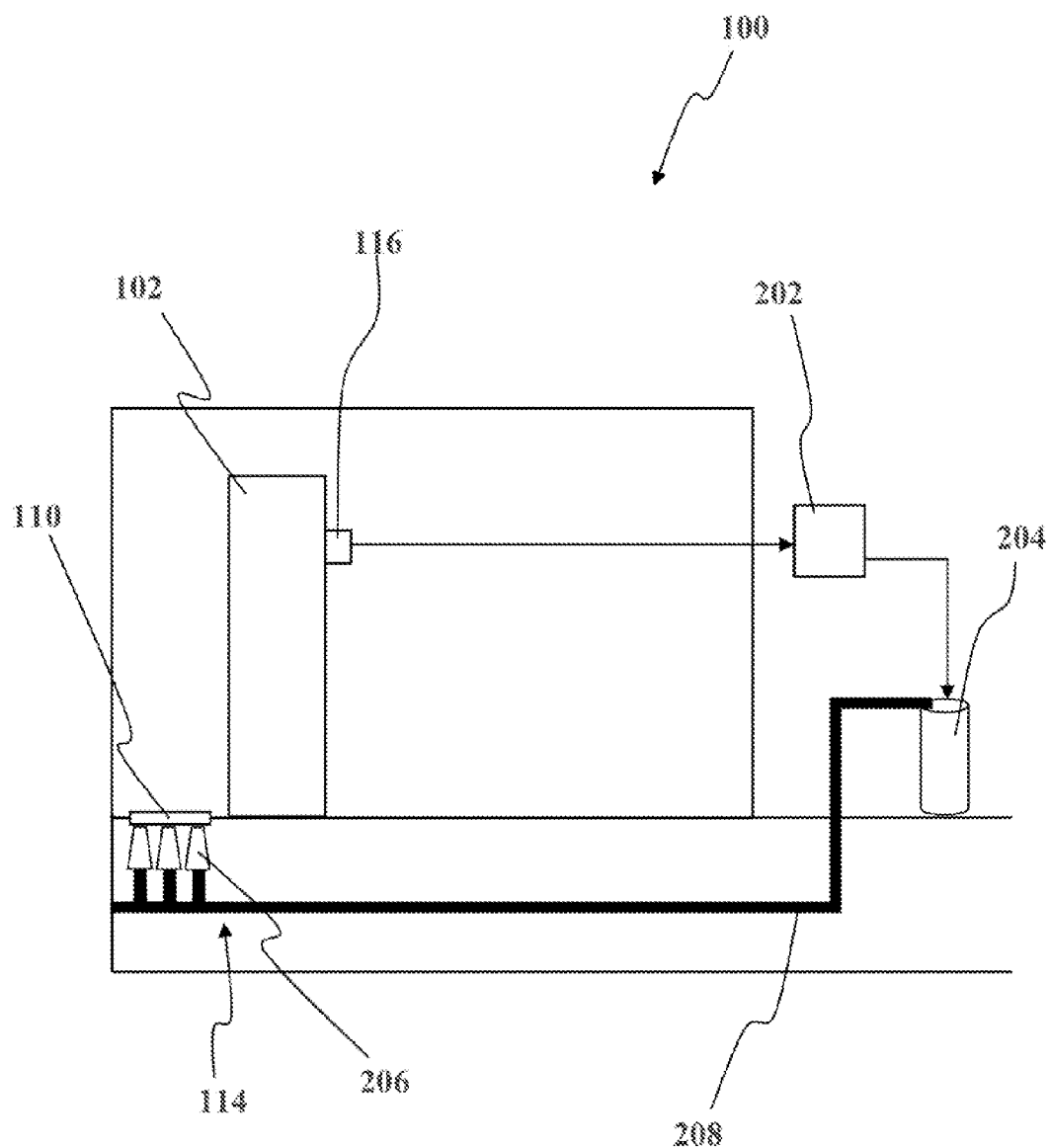
FIG. 2 representatively illustrates a control system coupled to the hot aisle/cold aisle fire suppression system in accordance with an exemplary embodiment of the present invention.

Referring now to FIGS. 1 and 2, in one embodiment, methods and apparatus for a hot aisle/cold aisle data center fire suppression system 100 may comprise a detection system 116 configured to generate a detection signal upon detection of a fire condition and a discharge system 114 configured to release a fire suppressant material into a cooling airflow 106. The fire suppression system 100 may further comprise a control system 202 communicatively linked to the detection system 116 and the discharge system 114.

Referring now to FIG. 1, the fire suppression system 100 may be adapted to suppress a fire condition that occurs within a computer cabinet 102 disposed within an enclosed environment 120 utilizing a hot aisle/cold aisle cooling system. The hot aisle/cold aisle cooling system may utilize an air handling unit 104 configured to receive a hot air flow 108 from the enclosed environment 120, remove heat from the hot air flow 108 to form a cooling airflow 106, and direct the cooling airflow 106 into a subfloor 122 located under the enclosed environment 120. The cooling airflow 106 may be routed through the subfloor 122 by any suitable method and may enter the enclosed environment 120 through a vent 110 connecting the subfloor 122 to the enclosed environment 120. The cooling airflow 106 may be directed to one side of the computer cabinet 102 to form a cold aisle. The cooling airflow 106 may then be drawn through an intake side 124 of the computer cabinet 102 by any suitable method to provide cooling to components such as computer servers, memory devices, routers, and the like positioned within the computer cabinet 102. The cooling airflow 106 absorbs heat from the components to form the heated airflow 108, which exits the computer cabinet 102 from an exhaust side 126, where the heated airflow 108 then flows to the air handling unit 104 to be cooled and recirculated.

The enclosed environment 120 may be any area that may experience a fire condition to be controlled by the fire suppression system 100. For example, the enclosed environment 120 may comprise the interior of a data center, server room, and/or other similar area. In the present embodiment, the enclosed environment 120 comprises a room housing one or more computer cabinets 102 having a subfloor 122. The enclosed environment 120 may be separated from the subfloor 122 by a floor having one or more vents 110 that allow for the passage of the cooling airflow 106 between the subfloor 122 and the enclosed environment 120. In an alternative embodiment, the cooling airflow 106 may be routed through a cooling system located in a wall or ceiling. For example, a similar closed-loop cooling system may direct the cooling airflow 106 from the air handler 104 through a ducting system positioned in a ceiling or one or more walls such that the vent 110 is located along a wall or ceiling.

The computer cabinet 102 houses one or more heat generating components and provides an airflow path between the intake side 124 and the exhaust side 126 of the computer cabinet 102 allowing for the thermal transfer of heat away from the heat generating components. The computer cabinet 102 may comprise any suitable system or device for housing components. For example, in one embodiment, the computer cabinet 102 may comprise a server rack measuring approximately twenty inches wide by seventy-two inches high. In another embodiment, the computer cabinet 102 may comprise a shelving system configured to store various types of electronic components.

The computer cabinet 102 may have one or more openings facing the cold aisle and the hot aisle to allow for the passage of air between the intake side 124 and the exhaust side 126 of the computer cabinet 102. The computer cabinet 102 may also have internal channels or ducts suitably configured to direct the cooling airflow 106 in a desired direction. The computer cabinet 102 may also comprise one or more fans suitably configured to facilitate the movement of air between the intake side 124 and the exhaust side 126 of the computer cabinet 102.

Figure 3:
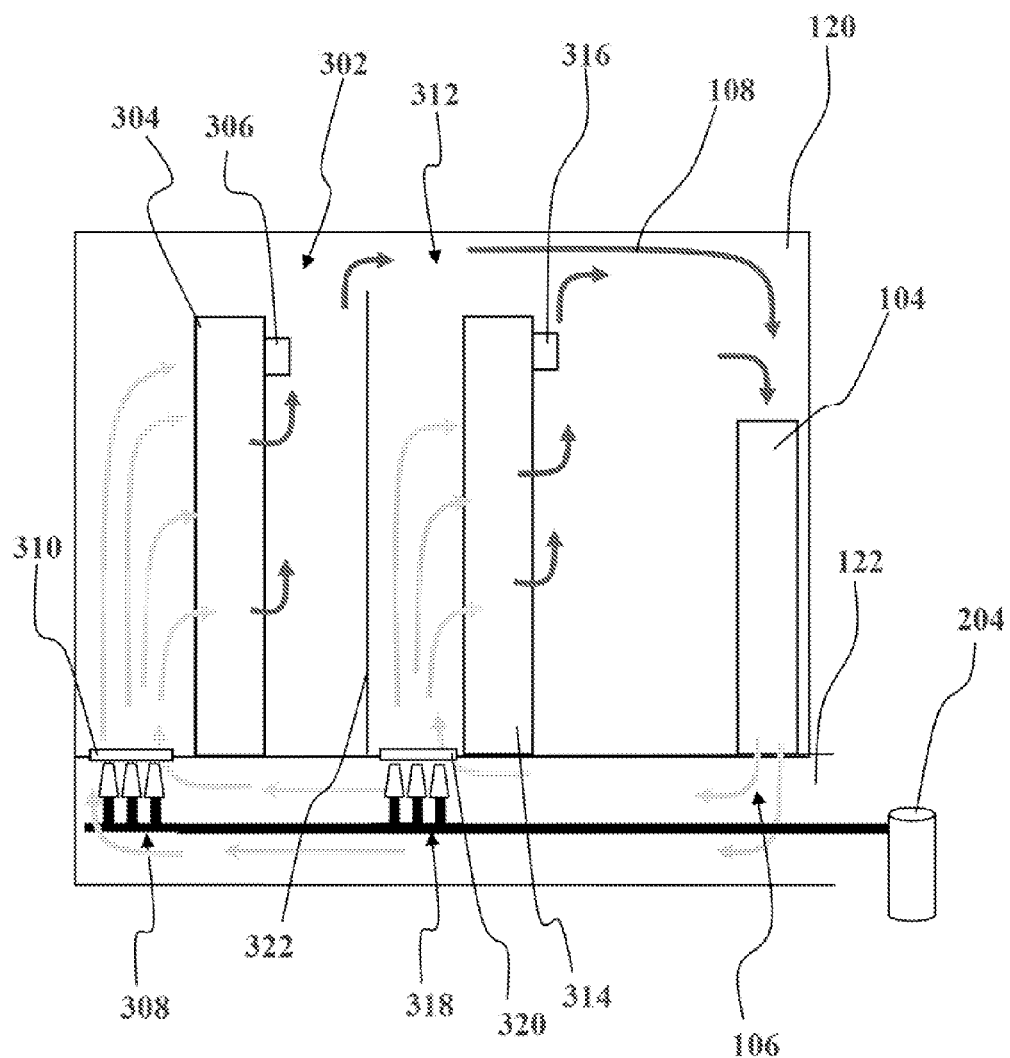
FIG. 3 representatively illustrates a multi-zone fire suppression system in accordance with an exemplary embodiment of the present invention.

Multiple computer cabinets and vents may be arranged within the enclosed environment 120 to form multiple zones. For example, referring now to FIG. 3, in one embodiment a first computer cabinet 304 may be located proximate to a first vent 310 and a second computer cabinet 314 may be located proximate to a second vent 320. A partition 322 may be located between the first and second computer cabinets 304, 314 to form a first zone 302 and a second zone 312 such that each zone may comprise a cold aisle and a hot aisle.

In addition multiple computer cabinets may be positioned adjacent to each other within a given zone forming a row of cabinets in each zone. Similarly, multiple vents may be located along the floor of the enclosed environment such that each cabinet in a zone is located proximate to a single vent. Alternatively, a bank of vents may be disposed along the floor of each cold aisle such that the number of vents making up the bank of vents is independent of the number of computer cabinets in a given zone.

Referring again to FIG. 1, the air handling unit 104 generates the cooling airflow 106. The air handling unit 104 may comprise any suitable system for creating a flow of air between the cold aisle and the hot aisle. For example, in the present embodiment, the air handling unit 104 comprises one or more units that cool a heated airflow 108 received from the enclosed environment 120 to generate a cooling airflow 106. The air handling unit 104 may then direct the cooling airflow 106 into the subfloor 122. Alternatively, the air handling unit 104 may direct the cooling airflow 106 into a ducting system positioned in a wall and/or a ceiling. The air handling unit 104 may be configured to provide any suitable predetermined level of cooling airflow 106.

The detection system 116 may be configured to couple to the exhaust side 126 of the computer cabinet 102 such that the detection system 116 is exposed to the heated airflow 108 exiting the computer cabinet 102. Alternatively, the detection system 116 may be positioned at any desirable location within the enclosed environment 120. For example, in one embodiment, the detection system 116 may comprise multiple sensors positioned throughout the enclosed environment 120 and communicatively linked to the control system 202. In another embodiment, the detection system 116 may comprise one or more detectors located within each zone.

The detection system 116 may generate a detection signal in response to a detected fire condition. The detection system 116 may comprise any suitable system or device for detecting one or more specific fire conditions and generating a corresponding signal, such as a smoke detector, an air ionization sensor, a temperature sensing device, a temperature sensitive device, obscuration and air sampling detection, fusible link, infrared detector, radiation detector, and/or the like. For example, in one embodiment, the detection system 116 is adapted to detect a fire and provide a corresponding detection signal to the control system 202.

The detection signal may comprise any appropriate signal for transmitting relevant information, such as an electrical pulse or signal, acoustic signal, mechanical signal, wireless signal, pneumatic signal, and the like. The detection system 116 may also trigger or activate the discharge system 114 by any suitable method. For example, in one embodiment, the detection system 116 may be electrically or mechanically coupled to a valve (not shown) of a container 204 of the discharge system 114 which is responsive to the detection signal and opens to release a fire suppressant material contained within the container 204. Referring now to FIG. 2, in an alternative embodiment, the detection signal may comprise an electronic signal generated in response to detection of the fire condition and communicated to the control system 202, which is suitably adapted to activate the discharge system 114 to disperse the fire suppressant into the cooling airflow 106.

As shown in FIG. 1, the discharge system 114 delivers the fire suppressant into the cooling airflow 106. The discharge system 114 may comprise any suitable method, component, or device for dispersing the fire suppressant into the cooling airflow 106 and/or computer cabinet 102. For example, referring now to FIG. 2, in one embodiment, the discharge system 114 may comprise the container 204, a dispersal device 206, and a delivery system 208 linking the container 204 to the dispersal device 206.

The discharge system 114 may also be configured to operate with multiple zones, wherein a particular zone or zones respond independently to a detected fire condition within a zone rather than flood the entire enclosed environment 120 with the fire suppressant. For example, referring now to FIG. 3, in an alternative embodiment, the discharge system 114 may comprise a set of dispersal devices 308, 318 for each zone.

Figure 4:
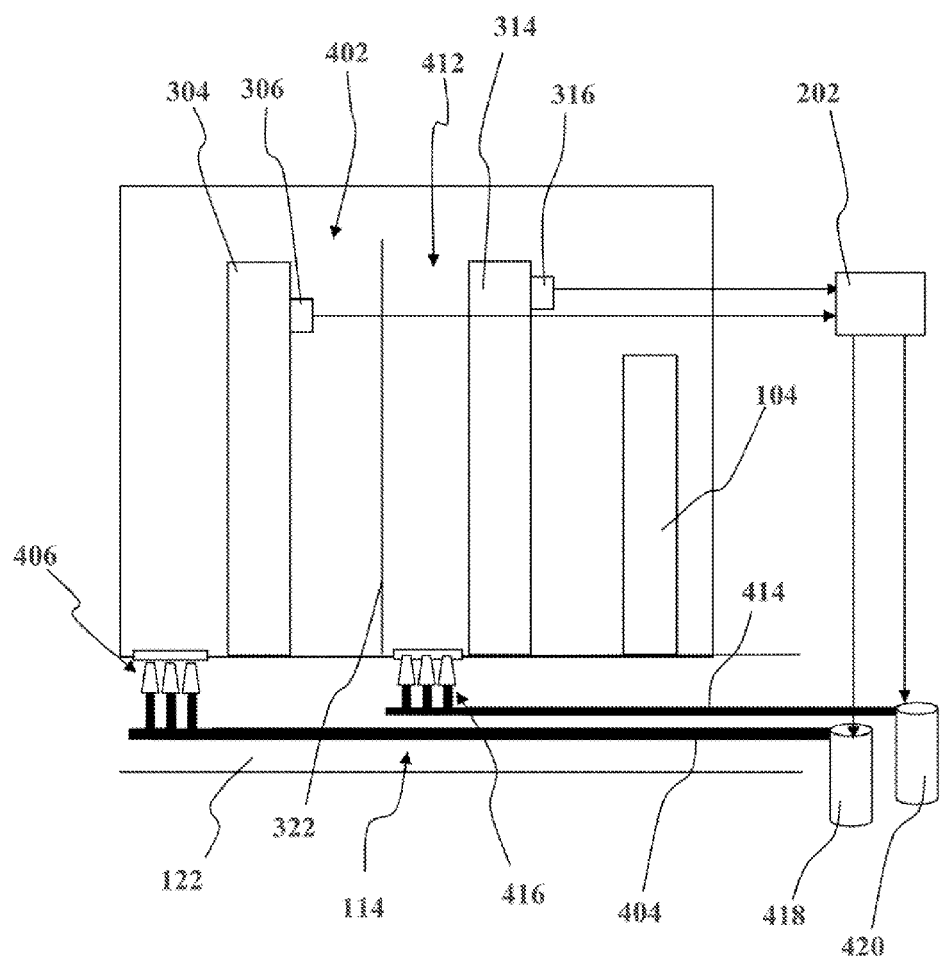
FIG. 4 representatively illustrates a multi-zone fire suppression system with individual delivery systems for each zone in accordance with an exemplary embodiment of the present invention.

Referring now to FIG. 4, in yet another embodiment, the discharge system 114 may be configured to function independently for the first and second zones 402, 412. For example, in the first zone 402, the discharge system 114 may comprise a first container 418, a first dispersal device 406, and a first delivery system 404. The first container 418 may be connected to the first dispersal device 406 via the first delivery system 404 to provide fire suppression capability to the first zone 402. In addition, the discharge system 114 may comprise a second container 420, a second dispersal device 416, and a second delivery system 414. The second container 420 may be connected to the second dispersal device 416 via the second delivery system 414 to provide fire suppression capability to the second zone 412.

The discharge system 114 may be further configured to discharge the fire suppressant into the cold aisle without the aid of the cooling airflow 106. For example, the discharge system 114 may be configured to maintain the fire suppressant under pressure such that the pressure differential between the system pressure of the discharge system 114 and the ambient environment will facilitate discharge of the fire suppressant into the computer cabinet 102. Alternatively, the discharge system 114 may be configured to self-pressurize in the event that the air handling unit 104 becomes inoperable during the fire condition and cannot supply sufficient cooling airflow 106 to aid distribution of the fire suppressant.

Referring again to FIG. 2, the dispersal device 206 may be configured to disperse the fire suppressant into the cooling airflow 106. The dispersal device 206 may comprise any suitable system or device for directing the fire suppressant into an ambient airflow moving past the dispersal device 206. For example, the dispersal device 206 may comprise one or more nozzles, atomizers, misters, ejectors, sprayers, and/or the like. The dispersal device 206 may be positioned substantially within the subfloor 122 or extend at least partially into the cold aisle of the enclosed environment 120. The dispersal device 206 may also be arranged within the subfloor 122 by any suitable method, such as single units evenly dispersed throughout the subfloor 122 or grouped together at predetermined locations.

For example, in one embodiment, the dispersal device 206 may comprise a plurality of nozzles individually coupled to the delivery system 208 and positioned just below the surface of the subfloor 122 at equidistant spaces along the vent 110 to the cold aisle, wherein each nozzle is configured to eject the suppressant substantially upwards and into the cooling airflow 106 moving into the cold aisle. Alternatively, the dispersal device 206 may be arranged in groups positioned just below the surface of the subfloor 122 and be configured to eject the fire suppressant into the cold aisle at multiple angles so that the cooling airflow 106 may assist in delivering the suppressant to the computer cabinet 102. In yet another embodiment, the dispersal device 206 may be positioned proximate to a vent located in a wall or ceiling.

The delivery system 208 may comprise any suitable system for supplying the fire suppressant to the dispersal device 206. The delivery system 208 may comprise a tube, a pipe, a duct, or a perforated hose. For example, in one embodiment, the delivery system 208 may comprise a piping system configured to provide a conduit path for the fire suppressant from the container 204 to the dispersal device 206. The delivery system 208 may comprise any suitable material such as metal, plastic, or polymer and may be suitably adapted to withstand elevated temperatures associated with fires, reduced temperatures associated with various fire suppressant materials, and/or exposure to caustic chemicals.

The container 204, which contains the fire suppressant, may comprise any suitable system for holding the fire suppressant such as a pressurized vessel, tank, bladder, drum, and the like. The container 204 may be suitably configured to contain a mass or volume of any material such as a liquid, gas, or solid material. The container 204 may also comprise any suitable material for a given application such as metal, plastic, or composite material. The fire suppressant may comprise any suitable material for suppressing an existing or imminent fire condition. For example, the fire suppressant may comprise a liquefied gas or combination of gasses that do not harm electronic devices such as hydrofluorocarbons, hydrochlorofluorocarbons, and/or hydrofluoroketones. Alternatively, the fire suppressant may comprise halon, a dry powder material, a liquid fire suppressant, an inert gas, or other refrigerant material.

The container 204 may comprise a pneumatic bottle configured to be pressurized to any suitable predetermined level. In one embodiment, the container 204 may hold the fire suppressant at a pressure of up to about 360 pounds per square inch (psi). In another embodiment, the container 204 may be configured to house the fire suppressant at a pressure of up to about 800-850 psi.

The container 204 may also comprise a valve connecting the delivery system 208. The valve may also control the release of, or rate of release of, the fire suppressant. The valve may comprise any suitable system for maintaining the pressurized volume of fire suppressant and for releasing that volume upon demand. For example, the valve may comprise a seal between the fire suppressant and the delivery system 208. The valve may be responsive to an activation signal from the detection system 116 and/or the control system 202 and be suitably adapted to break, open, or otherwise remove the seal in response to the activation signal from the control system 202. Once the seal has been broken the entire volume of the fire suppressant may be released to the delivery system 208.

In another embodiment, the valve may be suitably configured to control the rate of release of the fire suppressant. For example, the valve may comprise a ball or gate valve that is configured to be selectively activated to release a predetermined mass flow rate of fire suppressant. The rate of release may be dependent on a given application or location and may be related to the pressure within the container 204 relative to the ambient pressure in the enclosed environment 120 and/or subfloor 122.

The valve may also be configured to release the fire suppressant over a specific period of time. For example, the valve may be sized such that a total release of the fire suppressant occurs over a period of about sixty seconds. Alternatively, the valve may be suitably adapted to release the fire suppressant over a relatively short period of time such as 0.1 seconds. The valve may also be configured to sustain a constant level of the fire suppressant in a given volume based on signals from the control system 202.

The control system 202 monitors the detection system 116 and activates the discharge system 114 in the event of a detected fire condition. The control system 202 may comprise any suitable system or device for sending and receiving signals. The control system 202 may be configured to send and/or receive signals by any suitable method such as wirelessly or by a wired connection. Referring now to FIG. 2, the control system 202 may be communicatively linked to the detection system 116 and the discharge system 114. In one embodiment, the control system 202 may comprise a control panel suitably adapted to receive a detection signal from the detection system 116, process the detection signal, and send an activation signal to the discharge system 114 to initiate the release of fire suppressant.

Figure 5:
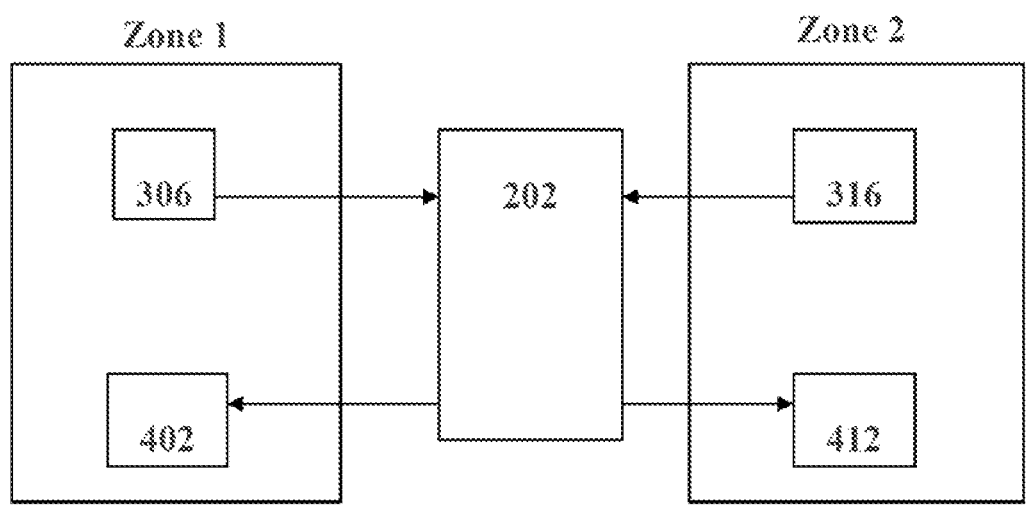
FIG. 5 is a block diagram of a hot aisle/cold aisle fire suppression system in accordance with an exemplary embodiment of the present invention.

The control system 202 may also be suitably adapted to direct the release of fire suppressant into multiple zones. For example, referring now to FIGS. 4 and 5, in one embodiment, the control system 202 may be communicatively linked to a first sensor 306 in the first zone 402 and a second sensor 316 in the second zone 412. In the event of a detected fire in the first zone 402, the first sensor 306 may send the detection signal to the control system 202. The control system 202 may then process the detection signal and send a corresponding activation signal to the discharge system 114 initiating the release of fire suppressant into the first zone 402.

The control system 202 may also be linked to an external system such as a general building alarm system and be suitably adapted to send an appropriate signal to the external system indicating the detection and/or successful suppression of a fire condition. The control system 202 may also be configured to function from a supplied source of power or operate off of a local power source such as a battery.

In addition, the control system 202 may be adapted to control the discharge of the fire suppressant by the discharge system 114. In one embodiment, the control system 202 may receive multiple signals from the detection system 116 and direct the activation of the discharge system 114 accordingly. For example, control system 202 may signal the discharge system 114 to deliver a onetime immediate discharge, a onetime discharge over a predetermined period of time, multiple discharges at calculated and/or predetermined intervals, and/or multiple discharges triggered by multiple detections of the fire or a re-ignition of the fire condition.

In operation, a detection system 116 may be coupled to a computer cabinet 102 located within an enclosed environment 120 such as a data center. An air handling unit 104 may also be located within the enclosed environment 120 and be suitably configured to receive a heated airflow 108 and direct a cooling airflow 106 into a subfloor 122 located beneath the enclosed environment 120. The cooling airflow 106 may be introduced back into the enclosed environment 120 through a cold aisle disposed along one side of the computer cabinet 102 through a vent 110 separating the enclosed environment 120 from the subfloor 122. The cooling airflow 106 is then drawn through an intake side 124 of the computer cabinet 102 and exhausted through an exhaust side 126 of the computer cabinet 102 into a hot aisle.

A discharge system 114 may be at least partially positioned within the subfloor 122 and be linked to the detection system 116 directly or through a control system 202. In the event that the detection system 116 detects a fire condition, a detection signal is generated by the detection system 116 which directly or indirectly causes the activation of the discharge system 114. Upon activation, the discharge system 114 disperses the fire suppressant into the flow of the cooling airflow 106 which then carries the fire suppressant into the cold aisle of the enclosed environment and subsequently into the computer cabinet 102.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. Furthermore, the connecting lines shown in the various figures are intended to represent exemplary functional relationships and/or steps between the various elements. Many alternative or additional functional relationships or physical connections may be present in a practical system.

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The invention claimed is:

1. A fire suppression system for a plurality of computer cabinets positioned in an enclosed environment separated from a subfloor by a floor having a plurality of vents, wherein a cooling airflow is directed into the enclosed environment through said plurality of vents, comprising:
   a discharge system responsive to a detection signal, wherein the discharge system comprises a set of dispersal devices disposed within the subfloor, wherein:
      a first dispersal device of said set of dispersal devices is positioned just below a first vent of said plurality of vents separating the subfloor from an intake side of a first computer cabinet of said plurality of computer cabinets;

a second dispersal device of said set of dispersal devices is positioned just below a second vent of said plurality of vents separating the subfloor from an intake side of a second computer cabinet of said plurality of computer cabinets;

each dispersal device of said set of dispersal devices is configured to release a fire suppressant into an area proximate to its respective vent; and the released fire suppressant is delivered to the intake sides of the first and second computer cabinets by the cooling airflow flowing upward from the first and second vents towards the intake sides of the first and second computer cabinets.

2. A tire suppression system according to claim 1, further comprising a detection system configured to couple to an exhaust side of the first and second computer cabinets, wherein the detection system is:

exposed to a heated airflow exiting from the exhaust side of the first and second computer cabinets; and adapted to generate the detection signal in response to a detected lire condition.

3. A lire suppression system according to claim 2, further comprising a control system communicatively linked to the detection system and the discharge system, wherein the control system is responsive to the detection signal and configured to activate the discharge system in response to the detection signal.

4. A fire suppression system according to claim 3, wherein the control system is adapted to control the release of the fire suppressant by the discharge system.

5. A fire suppression system according to claim 4, wherein:

the detection system is further adapted to generate a second detection signal in response to at least one of a continued fire condition and a reignition condition; and the control system is responsive to the second detection signal and further adapted to activate the discharge system to release an additional amount of the fire suppressant.

6. A fire suppression system according to claim 3, wherein:

the first dispersal device, the first vent, and the first computer cabinet define a first zone within the enclosed environment:

the second dispersal device, the second vent, and the second computer cabinet define a second zone within the enclosed environment;

the detection system is further exposed to a heated airflow exiting from the exhaust side of the second computer cabinet, and adapted to:

generate the detection signal as a first detection signal in response to a detected fire condition within the first zone; and generate a second detection signal in response to a detected fire condition within the second zone; and the control system is responsive to the first and second detection signals and configured to cause the discharge system to:

release the fire suppressant through the first dispersal device in response to the first detection signal; and release the fire suppressant through the second dispersal device in response to the second detection signal.

7. A fire suppression system according to claim 1, wherein the discharge system further comprises:

a container configured to contain the fire suppressant; and a delivery system coupled between the container and the set of dispersal devices, wherein the delivery system is configured to provide a conduit for the fire suppressant from the container to the set of dispersal devices.

8. A fire suppression system according to claim 7, wherein the container comprises:

a pressure vessel configured to contain the tire suppressant at a predetermined pressure; and a deployment valve coupled between the pressure vessel and the delivery system, wherein the deployment valve is adapted to control a rate of release of the fire suppressant to the delivery system.

9. A fire suppression system according to claim 1, wherein the each dispersal device comprises a nozzle disposed in the subfloor and proximate to its respective vent.

10. A fire suppression system for a plurality of computer cabinets positioned in an enclosed environment having a cooling airflow directed into the enclosed environment through a plurality of vents, comprising:

a discharge system responsive to a detection signal comprising a set of dispersal devices, wherein:

a first dispersal device from the set of dispersal devices is disposed proximate to a first vent from the plurality of vents and configured to release a fire suppressant into an area proximate to the first vent;

a second dispersal device from the set of dispersal devices is disposed proximate to a second vent from the plurality of vents and configured to release the fire suppressant into an area proximate to the second vent; and the released lire suppressant is delivered to an intake side of the plurality of computer cabinets by the cooling airflow flowing through the plurality of vents towards the intake side of the plurality of computer cabinets.

11. A fire suppression system according to claim 10, further comprising a detection system configured to couple to an exhaust side of the plurality of computer cabinets, wherein the detection system is:

exposed to a heated airflow exiting from the exhaust side of the plurality of computer cabinets; and adapted to generate the detection signal in response to a detected fire condition.

12. A lire suppression system according to claim 11, wherein the discharge system further comprises:

a container configured to contain the lire suppressant; and a delivery system coupled between the container and the set of dispersal device, wherein the delivery system is configured to provide a conduit for the fire suppressant from the container to the set of dispersal devices.

13. A fire suppression system according to claim 12 wherein the container comprises;

a pressure vessel configured to contain the lire suppressant at a predetermined pressure; and a deployment valve coupled to the pressure vessel, wherein the deployment valve is adapted to control a rate of release of the tire suppressant to the delivery system.

14. A lire suppression system according to claim 11, further comprising a control system communicatively linked to the detection system and the discharge system, wherein the control system is responsive to the detection signal and configured to activate the discharge system in response to the detection signal.

15. A fire suppression system according to claim 10, wherein each dispersal device from the set of dispersal devices comprises a nozzle disposed proximate to at least one vent from the plurality of vents.

16. A method of providing fire suppression to a plurality of computer cabinets positioned in an enclosed environment having a subfloor with a cooling airflow, comprising:
positioning a set of dispersing devices adjacent to a plurality of vents in the subfloor proximate the plurality of computer cabinets, wherein:
the set of dispersing devices are configured to release a fire suppressant into an area proximate to the plurality of vents; and
the released fire suppressant is delivered to an intake side of the plurality of computer cabinet by the cooling airflow flowing upward from the subfloor through the plurality of vents towards the intake side of the plurality of computer cabinets.

17. A method of providing fire suppression to a plurality of computer cabinets according to claim 16, further comprising positioning a sensing device adjacent to an exhaust side of the plurality of computer cabinets, wherein the sensing device is adapted to generate a detection signal in response to a sensed tire condition within the plurality of computer cabinets.

18. A method of providing fire suppression to a plurality of computer cabinets according to claim 17, further comprising processing the detection signal with a control system coupled to the sensing device and the set of dispersing devices, wherein the control system is adapted to activate the set of dispersing devices in response to the processed detection signal.

19. A method of providing fire suppression to a plurality of computer cabinets according to claim 18, further comprising controlling an amount of fire suppressant released from the set of dispersing devices with the control system.

20. A method of providing tire suppression to a plurality of computer cabinets according to claim 16, wherein releasing the fire suppressant into the area proximate to the plurality of vents comprises:
routing the fire suppressant from a storage container through to delivery system disposed within the subfloor to the set of dispersing devices; and
dispersing the tire suppressant into the airflow in the area proximate to the plurality of vents.

* * * * *

UNITED STATES PATENT AND TRADEMARK OFFICE
CERTIFICATE OF CORRECTION

Page 1 of 1

PATENT NO. : 9,010,449 B2
APPLICATION NO. : 13/559190
DATED : April 21, 2015
INVENTOR(S) : Eckholm et al.

It is certified that error appears in the above-identified patent and that said Letters Patent is hereby corrected as shown below:

In the claims
Column 9, claim 2, line 17, delete "tire" and insert --fire--,
Column 9, claim 2, line 25, delete "lire" and insert --fire--,
Column 9, claim 3, line 26, delete "lire" and insert --fire--,
Column 10, claim 8, line 10, delete "tire" and insert --fire--,
Column 10, claim 9, line 17, delete the word "the",
Column 10, claim 12, line 46, delete "lire" and insert --fire--,
Column 10, claim 12, line 48, delete "lire" and insert --fire--,
Column 10, claim 12, line 50, delete "device" and insert --devices--,
Column 10, claim 13, line 55, delete "lire" and insert --fire--,
Column 10, claim 13, line 59, delete "tire" and insert --fire--,
Column 10, claim 14, line 60, delete "lire" and insert --fire--,
Column 11, claim 16, line 13, delete "cabinet" and insert --cabinets--,
Column 11, claim 17, line 22, delete "tire" and insert --fire--,
Column 12, claim 20, line 12, delete "tire" and insert --fire--,
Column 12, claim 20, line 19, delete "tire" and insert --fire--.

Signed and Sealed this
Twenty-ninth Day of December, 2015

Michelle K. Lee
*Director of the United States Patent and Trademark Office*